United States Patent [19]

Kikuchi et al.

[11] Patent Number: 4,748,293
[45] Date of Patent: May 31, 1988

[54] FLEXIBLE CABLE AND METHOD OF MANUFACTURING THEREOF

[75] Inventors: Hiroshi Kikuchi; Jiro Tanuma; Naoji Akutsu, all of Tokyo, Japan

[73] Assignee: Oki Electric Industry Co., Ltd., Tokyo, Japan

[21] Appl. No.: 832,753

[22] Filed: Feb. 25, 1986

[30] Foreign Application Priority Data

Feb. 25, 1985 [JP] Japan .................................. 60-34503

[51] Int. Cl.⁴ .............................................. H01B 7/08
[52] U.S. Cl. ............................. 174/117 PC; 174/115; 174/117 FF
[58] Field of Search ......... 174/117 PC, 117 R, 117 F, 174/117 FF, 32, 34, 115; 333/238; 361/398, 212, 220; 339/17 F; 439/492

[56] References Cited

U.S. PATENT DOCUMENTS

| | | | |
|---|---|---|---|
| 3,107,197 | 10/1963 | Stein et al. .................... | 174/117 PC |
| 3,168,617 | 2/1965 | Richter ......................... | 174/117 FF |
| 3,391,246 | 7/1968 | Freeman et al. .............. | 174/117 FF |
| 3,523,844 | 8/1970 | Crimmins et al. ............ | 174/117 F |
| 3,704,164 | 11/1972 | Travis ........................... | 174/117 FF X |
| 3,891,955 | 6/1975 | Horton, III .................... | 174/117 FF X |
| 4,209,215 | 6/1980 | Verma ............................ | 174/36 X |
| 4,564,723 | 1/1986 | Lang .............................. | 174/117 F X |

OTHER PUBLICATIONS

"Berg Clincher Connector", Hakuto Co., Ltd., 10-82 (no translation).

Primary Examiner—Morris H. Nimmo
Attorney, Agent, or Firm—Wenderoth, Lind & Ponack

[57] ABSTRACT

A flexible cable has a grounding pattern or patterns provided therein. Thereby, when an object having static electricity of high voltage is caused to approach the flexible cable, dielectric breakdown of a base and cover of a high polymer material of the cable, to a conducting portion of the cable which is not exposed at the interior of the flexible cable is prevented, and damage to an electronic circuit connected with the not exposed portion, due to electric discharge, can be prevented by causing the static electricity to be discharged to the exposed grounding pattern.

6 Claims, 5 Drawing Sheets

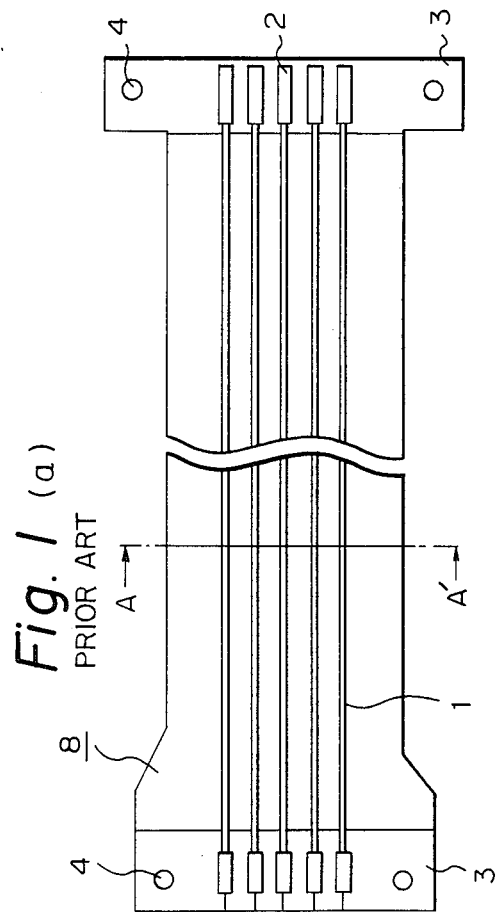
Fig. 1 (a) PRIOR ART
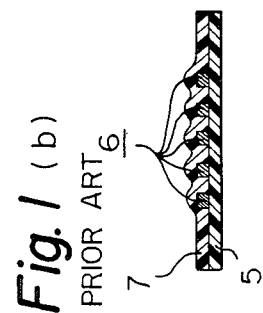
Fig. 1 (b) PRIOR ART

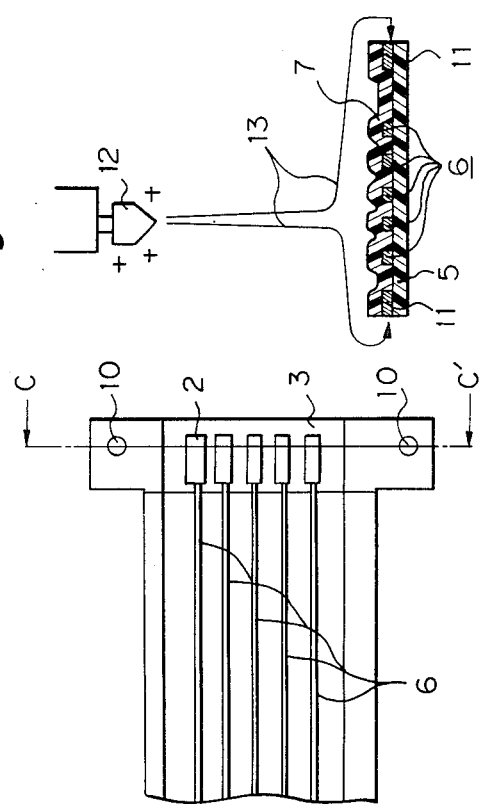
Fig. 2 (a)
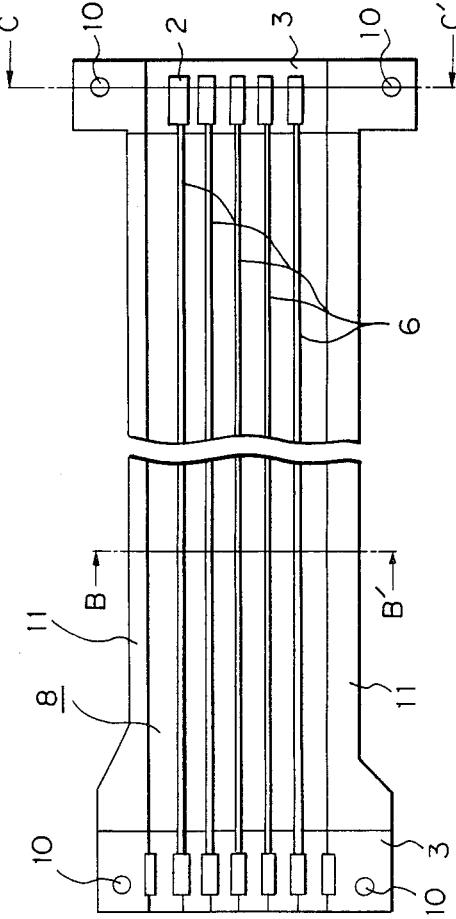
Fig. 2 (b)
Fig. 2 (c)
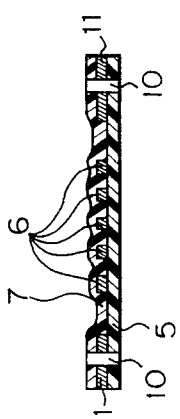
Fig. 3

FLEXIBLE CABLE AND METHOD OF MANUFACTURING THEREOF

BACKGROUND OF THE INVENTION

1. Field of the Invention

The present invention relates to a flexible cable having excellent dielectric resistance against static electricity.

2. Description of the Prior Art

A flexible printed circuit board in recent years has been profitably employed, for example as a circuit board or as wiring parts, in various fields as an important part for use in mounting thereon many electronic circuits which are central to computer applications. Such a flexible printed circuit board has a multilayer structure adapted to directly mount electronic parts thereon, is miniaturized and lightweight, and its flexible structure facilitates use within a limited space for higher density mounting. Employed as wiring parts, the flexible printed board is used to wire together individual connections in a wire harness so as to be useful for the elimination or reduction of labor as well as prevention of erroneous wiring. In addition, it is also in wide use for wiring various movable portions in view of the flexible and lightweight structure thereof.

Referring to FIGS. 1(a) and 1(b) illustrating a prior flexible cable structure, a flexible cable has a conducting part 1, and at each end thereof a terminal 2 which is an extension of the conducting part 1, and a lug 3 for attaching thereto setscrews in locking holes 4. The flexible cable includes a base 5 comprising a high polymer material such, for example, as polyester and polyimide. The base 5 is formed of a flame-retardant material with a thickness of several tens of micrometers. Designated at 6 are copper foil patterns forming the conducting part 1 and patterned by subjecting a copper foil bonded onto the base 5 to etching. A cover layer 7 formed by the same material as that of the base 5 is arranged to cover the copper foil patterns 6 on the base 5. Designated at 8 is an insulator part comprising the base 5 and the cover layer 7. Since the terminals 2 are intended to be brought into contact with a pattern of another part (not shown) a portion of the cover layer 7 is eliminated in the area of terminals 2. Moreover, the terminals 2 are, since they are subject to deterioration of contact resistance, subjected to further processing, for example a gold plating operation. The copper foil patterns 6 are positioned at intervals capable of ensuring dielectric strength with respect to adjoining pattern portions and are maintained a distance away from both sides of the insulator 8. The cover layer 7 and the copper foil patterns 6 respectively have thicknesses of about several tens of micrometers and are capable of bending. Accordingly, the flexible cable may be used for transmitting an electric signal to a movable mechanical member such as a printer carriage cable.

However, such a prior flexible cable suffers from certain drawbacks. Namely, when an object having static electricity of high voltage is brought near a flexible cable of the type described above, a high electric field is generated between the conductive part of the cable and the object, whereby any high polymer material such as polyester, etc., located therebetween is polarized. Therefore, the cover layer is subjected to dielectric breakdown and this causes electric discharges to be produced among different of the copper foil patterns. Thus, any electric circuit connected with the copper foil patterns is subject to damage.

SUMMARY OF THE INVENTION

It is an object of the present invention to provide a flexible cable capable of preventing the cover layer from being subjected to dielectric breakdown, even when an object having static electricity of high voltage is brought near the flexible cable.

Another object of the present invention is to provide a flexible cable capable of preventing an electronic circuit connected with the conductive part of the cable from being damaged, even if the cover layer is subjected to dielectric breakdown owing to its exposure to static electricity of high voltage to cause electric discharge in the conductive part.

According to the present invention, a flexible cable provided with a pattern to be used as an FG (flame ground) is exposed at at least part of the pattern to a signal line therealong and extended to terminals. The pattern is directly connected to the FG, etc., to be grounded via connectors, etc.

According to the present invention, the flexible cable includes a base, a conductor composed of a plurality of patterns and a cover layer laminated and bonded to the base and over the patterns. The cover layer is bonded so that at least one of the patterns is exposed in the longitudinal direction thereof.

According to one embodiment of the present invention, the flexible cable is cut off along both sides or one side thereof so that two or one of the patterns are exposed.

According to the present invention, when an object having static electricity of high voltage is brought near to the flexible cable, spark discharge is caused, before any spark discharge is produced between the object and any of the conducting patterns used as signal lines, between the object and that pattern or patterns serving as a ground line or lines and that are at least partly exposed to the outside. Accordingly, dielectric breakdown of the insulator portion of the cable, caused by static electricity of high voltage, and damage to an electric circuit of any apparatus connected with the patterns employed as signal lines, can be prevented.

Moreover, according to the present invention, a flexible cable having a conducting part comprising a plurality of patterns can be manufactured with ease by permitting the cover layer to be laminated over a prescribed portion of the patterns so as to provide the ground patterns to be at least partly exposed longitudinally thereof.

Furthermore, according to the present invention, a flexible cable having a conductive part comprising a plurality of patterns can be manufactured with ease by cutting away side portions of the cable, whereby pattern edges located along both sides of the flexible cable or along one of the sides thereof are exposed.

The above and other objects, features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIGS. 1(a) and 1(b) are respectively a plan view, with a cover layer omitted for clarity, and a cross-sectional view along line A—A' of FIG. 1(a), both illustrating a prior flexible cable;

FIGS. 2(a), 2(b) and 2(c) are respectively a plan view, with a cover layer omitted for clarity, a cross-sectional view along line B—B' of FIG. 2(a), and a cross-sectional view along line C—C' of FIG. 2(a), all illustrating an embodiment of a flexible cable according to the present invention;

FIG. 3 is a view illustrating the effect of the present invention;

DESCRIPTION OF THE PREFERRED EMBODIMENTS

Figure 4A:
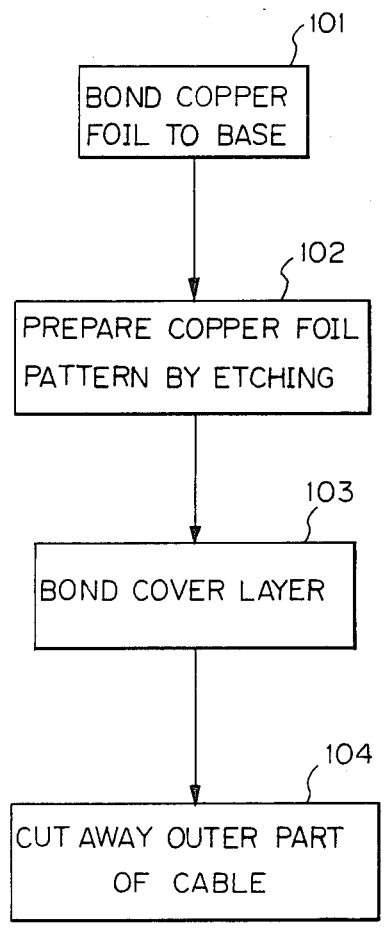
FIG. 4(a) is a flowchart illustrating an embodiment of a method of manufacturing a flexible cable according to the present invention.
Figure 4B:
FIGS. 4(b), 4(c), 4(d) and 4(e) are cross-sectional views of a flexible cable produced during each of the steps of the method of FIG. 4(a)
Figure 4C:
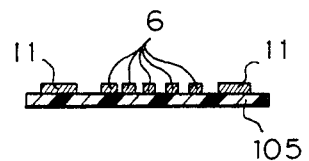
Figure 4D:
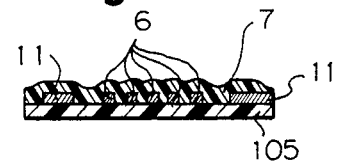
Figure 4E:
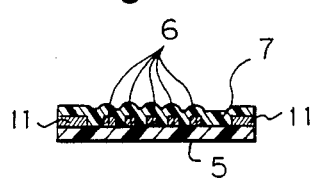

The structure and method of manufacture of a flexible cable according to the present invention will be described with reference to the accompanying drawings wherein the same symbols are applied to common elements throughout the drawings.

As shown in FIG. 2(a) illustrating and embodiment of a flexible cable according to the present invention, the flexible cable includes additional copper foil patterns formed to extend fully along both sides of the known flexible cable of FIG. 1. In more detail, copper foil patterns 11 having laterally exposed edges are formed to extend along both sides of the flexible cable, in addition to copper foil patterns 6 used as usual signal lines, and furthermore are extended to the terminals 2 or to lug holes 10. The cover layer 7 may be eliminated at lug holes 10 and at the terminals 2. These portions are brought into close contact with other elements or parts, e.g., an FG pattern of a base substrate (not shown) assembled into a business machine, or they are structured to secure electric contact with both side copper foil patterns 11 via connectors, etc.

Referring also to FIG. 2(c), it is understood that besides the usual copper foil patterns 6, the copper foil patterns 11 having exposed edges at both sides of the flexible cable may extend to peripheral edges of the locking holes 10 and may have upper parts covered with the cover layer 7.

In FIG. 3 illustrating the effect of the present invention, an electric discharge path or route is shown for static electricity of high voltage (e.g. 10 to 20 kV) brought near the flexible cable.

Upon gradually moving an object charged to a high voltage, such as a probe 12, to the flexible cable from a distant location, an electric field (electric lines of force) is concentrated among the tip of the probe 12 and the copper foil patterns 6 used as signal lines located in the flexible cable. Thereupon, spark discharge is caused, before the cover layer 7 is subjected to dielectric breakdown, due to the high dielectric strength of the flexible cable. Spark discharge is caused among the cover layer itself and the copper foil patterns 6 and among the cover layer and the edges of the copper foil patterns 11 disposed on both sides of the flexible cable, namely, between the cover layer and the atmosphere which has a lower dielectric strength than the cover layer 7. Accordingly, electric charges with which the probe 12 is charged are drawn to ground potential through the copper foil patterns 11, i.e. the FG pattern, and removed, whereby dielectric breakdown of the cover layer 7 due to static electricity can be prevented. Here, although the copper foil patterns 11 are formed on both sides of the flexible pattern in the above description, only one copper foil pattern may be formed on either of the sides without imposing any appreciable bad affect thereon.

A method of manufacturing the flexible cable so constructed is described below.

As shown in FIGS. 4(a)-4(e) providing a flowchart and cross-sectional views relating to an embodiment of the method of manufacturing the flexible cable according to the present invention, a base 105 comprising a high polymer material such as polyester, etc., and copper foil 116 is first prepared, and in Step 101 the copper foil 116 is bonded to and laminated on the base 105. In Step 102, the laminated copper foil is subjected to etching to form copper foil patterns 6 and 11 on the base 105. In Step 103, the cover layer 7 is bonded to the base 105 on the side thereof having copper foil patterns 6, 11 to cover the copper foil patterns 6 and 11. In Step 104, the outer parts or sides of the flexible cable so formed are cut off to a prescribed shape. In the illustrated embodiment, the copper foil patterns 11, i.e. patterns for grounding, are cut through so as to be exposed on both sides of the flexible cable.

Step 104 is particularly important for the method of manufacturing the flexible cable according to the present invention wherein the copper patterns 11 are cut through while parts thereof are left behind. At least one copper foil pattern 11 may be cut entirely away.

Figure 5:
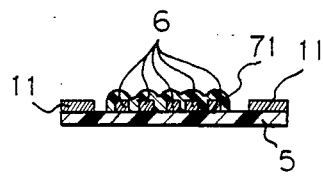
FIGS. 5(a) and 5(b) are cross-sectional views illustrating other embodiments of flexible cables according to the present invention.
Figure 5:
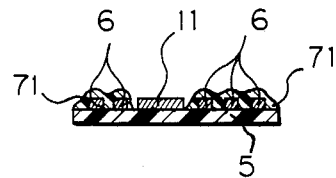
Figure 6:
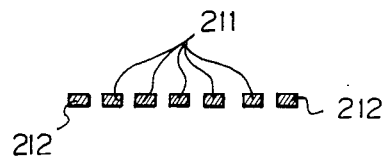
FIG. 6(a) is a flowchart illustrating another embodiment of a method of manufacturing a flexible cable according to the present invention.
FIGS. 6(b), 6(c), 6(d) and 6(e) are cross-sectional views of a flexible cable produced during each of the steps of the method in FIG. 6(a).
Figure 6:
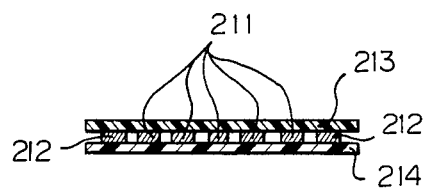
Figure 6:
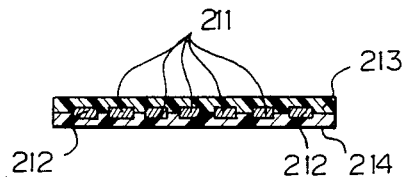
Figure 6:
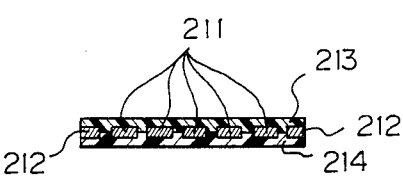
Figure 6A:
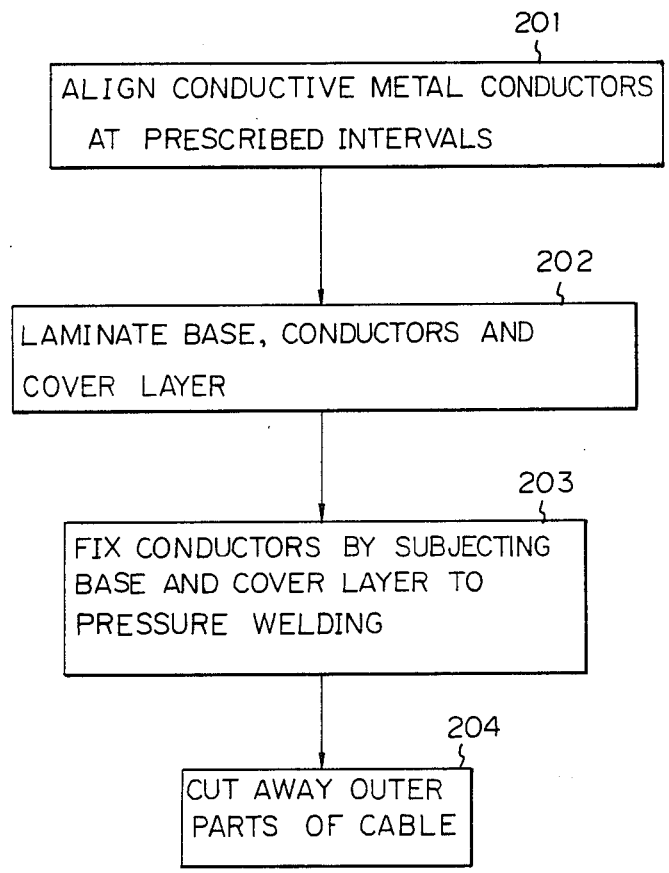

Referring to FIGS. 5(a) and 5(b) illustrating, in cross section, other embodiments of the flexible cable according to the present invention, the cover layer 71 is bonded to the base 5 so as to cover only the copper foil patterns 6 while leaving the copper foil pattern or patterns 11 exposed. This operation is effected in Step 103 in FIG. 4(a). Here, the copper foil patterns 11 need not be cut away as in Step 104. Moreover, in this case, the copper foil pattern or patterns used for a grounding conductor may be provided, as shown in FIG. 5(a), on both sides or one side of the flexible cable, or as shown in FIG. 5(b), between patterns 6.

In FIGS. 6(a)-6(e) providing a flowchart and cross sections illustrating another embodiment of a method of manufacturing the flexible cable according to the present invention, a base 214 comprising a high polymer material such as polyester, etc., and a cover layer 213 are first prepared, and in Step 201 a plurality of thin sheet-like metal conductors 211, 212 to serve as conducting parts of the cable are aligned in spaced relation at prescribed intervals, e.g. by making use of a jig. In Step 202, the metal sheet conductors 211, 212 are put between base 214 and cover layer 213 in a sandwiching relation and laminated. In Step 203, the base 214 and the cover layer 213 are subjected to thermocompression bonding from both sides thereof to fix the metal conductors 211, 212. In Step 204, the flexible cable so constructed is cut away to a prescribed shape. In the illustrated embodiment, the flexible cable is so cut through that the metal conductors 212, i.e. the patterns for grounding, are exposed on both sides of the flexible cable. Also, the metal conductor 212 on either side of the flexible cable may be cut off.

Furthermore, in Step 202 or Step 203, the cover layer 213 may cover only the metal conductor 211 while the metal conductors 212 are left exposed. In this case, in Step 204 the metal conductors 212 need not be cut through. This case corresponds to that of FIG. 5(a). In addition, a metal conductor 212 may be disposed between conductors 211, similar to the arrangement of FIG. 5(b).

Although certain preferred embodiments have been shown and described, it should be understood that many changes and modifications may be made thereto without departing from the scope of the appended claims.

What is claimed is:

1. A longitudinally extending flexible cable having opposite lateral edges, said flexible cable comprising:
   a longitudinally extending base of insulating material;
   a plurality of longitudinally extending conductors spaced laterally from each other in the width direction of said base;
   a longitudinally extending cover layer of insulating material covering said conductors;
   said base and said cover layer forming insulation enclosing said conductors and insulating said conductors from each other;
   means for protecting said insulation from dielectric breakdown resulting from subjecting said cable to an exterior source of high voltage static electricity, said protecting means comprising at least one additional conductor extending longitudinally at a position spaced laterally from said conductors, said insulation insulating said conductors from said additional conductor, and said additional conductor being exposed over the entire length thereof to the exterior of said cable.

2. A flexible cable as claimed in claim 1, wherein said at least one additional conductor is located at one of said lateral edges of said cable and is exposed only at said one lateral edge.

3. A flexible cable as claimed in claim 1, comprising two said additional conductors, one each said additional conductor being located and exposed only at a respective said lateral edge of said cable.

4. A flexible cable as claimed in claim 1, wherein said at least one additional conductor is positioned between said base and said cover layer and is exposed only at one of said lateral edges of said cable.

5. A flexible cable as claimed in claim 1, wherein said cover layer is bonded over said conductors and said base and over said additional conductor other than the exposed portion thereof.

6. A flexible cable as claimed in claim 1, wherein said at least one additional conductor is located laterally between two said conductors.

* * * * *